US010396661B2

(12) United States Patent
Sawano et al.

(10) Patent No.: US 10,396,661 B2
(45) Date of Patent: Aug. 27, 2019

(54) POWER SUPPLY CONTROL APPARATUS

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Shunichi Sawano, Mie (JP); Yuuki Sugisawa, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/302,740

(22) PCT Filed: May 9, 2017

(86) PCT No.: PCT/JP2017/017553
§ 371 (c)(1),
(2) Date: Nov. 19, 2018

(87) PCT Pub. No.: WO2017/199793
PCT Pub. Date: Nov. 23, 2017

(65) Prior Publication Data
US 2019/0181751 A1  Jun. 13, 2019

(30) Foreign Application Priority Data

May 20, 2016  (JP) .................................. 2016-101584

(51) Int. Cl.
*H02M 3/156* (2006.01)
*H03K 17/687* (2006.01)
*H03K 17/06* (2006.01)

(52) U.S. Cl.
CPC .......... *H02M 3/156* (2013.01); *H03K 17/063* (2013.01); *H03K 17/687* (2013.01)

(58) Field of Classification Search
CPC .................. H02M 3/07; H02M 3/156; H02M 2003/1566; H02M 3/157; H02M 3/158;
(Continued)

(56) References Cited

U.S. PATENT DOCUMENTS 5,648,739 A      7/1997  Walther et al.
6,304,422 B1 *  10/2001  Sander ................. H02H 11/003
                                              307/127
(Continued)

FOREIGN PATENT DOCUMENTS

JP    H3141720 A     6/1991
JP    2002037099 A   2/2002
JP    2005217497 A   8/2005

OTHER PUBLICATIONS

International Search Report, Application No. PCT/JP2017/017553 dated Aug. 1, 2017.

*Primary Examiner* — Adolf D Berhane
(74) *Attorney, Agent, or Firm* — Honigman LLP

(57) ABSTRACT

In a power supply control apparatus, when a semiconductor switch is switched ON, a charging circuit increases a base voltage. A first switch is ON if a differential voltage obtained by subtracting a gate voltage from a base voltage is at least a first reference voltage, and is OFF if the differential voltage is smaller than the first reference voltage. If the first switch is ON, a battery or a capacitor charges parasitic capacitors of the semiconductor switch.

7 Claims, 5 Drawing Sheets

(58) Field of Classification Search
CPC ....... H03K 17/063; H03K 17/687; H02J 7/00;
H02J 7/0068
See application file for complete search history.

(56) References Cited

U.S. PATENT DOCUMENTS

| | | | |
|---|---|---|---|
| 2007/0159150 A1* | 7/2007 | Hosokawa .......... | H02M 3/1588 |
| | | | 323/285 |
| 2008/0054855 A1* | 3/2008 | Hussain ................ | H02J 7/0057 |
| | | | 320/162 |
| 2013/0214824 A1* | 8/2013 | Umetani .............. | H03K 17/063 |
| | | | 327/109 |
| 2017/0187283 A1* | 6/2017 | Vaidya .................. | H02M 3/158 |
| 2019/0103867 A1* | 4/2019 | Sugisawa .................. | H02J 7/00 |
| 2019/0123739 A1* | 4/2019 | Sugisawa .................. | H02J 1/00 |

\* cited by examiner

POWER SUPPLY CONTROL APPARATUS

CROSS-REFERENCE TO RELATED APPLICATIONS

This application is the U.S. national stage of PCT/JP2017/017553 filed May 9, 2017, which claims priority of Japanese Patent Application No. JP 2016-101584 filed May 20, 2016.

TECHNICAL FIELD

The present disclosure relates to a power supply control apparatus.

BACKGROUND

JP 4252091B discloses a power supply control apparatus that controls power supply to a load from a DC power supply, which is typically a battery. In this power supply control apparatus, a semiconductor switch is arranged midway in a power supply path through which the DC power supply supplies power to the load. A current flows through the power supply path if the semiconductor switch is ON, and no current flows through the power supply path if the semiconductor switch is OFF. Power supply from the DC power supply to the load is controlled by switching ON and OFF the semiconductor switch.

In the power supply control apparatus described in JP 4252091B, the DC power supply is connected to a control end of the semiconductor switch via a switch. When the semiconductor switch is switched from OFF to ON, the switch is switched from OFF to ON. Thus, electric power is supplied from the DC power supply to a parasitic capacitor with an end connected to the control end.

The voltage at the control end increases with an increase in electric power stored in the parasitic capacitor. If the voltage at the control end becomes greater than or equal to an ON threshold, the semiconductor switch switches from OFF to ON. The DC power supply can continue to supply a large amount of electric power to the parasitic capacitor for a long period of time. Thus, in the power supply control apparatus described in JP 4252091B, the semiconductor switch can be quickly switched from OFF to ON.

SUMMARY

A power supply control apparatus according to an aspect of the present disclosure is a power supply control apparatus that includes a semiconductor switch that is arranged midway in a power supply path and is ON if a voltage at a control end of the semiconductor switch is at least a threshold, the power supply control apparatus including: a second semiconductor switch that is arranged midway in the power supply path on an upstream side of the semiconductor switch, the second semiconductor switch being ON if a voltage at a control end thereof is at least a second threshold; a resistor connected between one end of the power supply path on a current input side and the control end of the second semiconductor switch; a diode having an anode connected to the control end of the semiconductor switch, and a cathode connected to the control end of the second semiconductor switch; a voltage output unit for outputting a voltage; and a switch connected between the one end of the power supply path and the control end of the semiconductor switch, wherein the switch is ON if a differential voltage obtained by subtracting the voltage at the control end of the semiconductor switch from an output voltage that is output by the voltage output unit is at least a predetermined voltage, and is OFF if the differential voltage is smaller than the predetermined voltage.

BRIEF DESCRIPTION OF DRAWINGS

FIG. 2 is a diagram illustrating switching of a semiconductor switch from OFF to ON.
FIG. 5 is a diagram illustrating switching of the semiconductor switch from OFF to ON.

DETAILED DESCRIPTION OF PREFERRED EMBODIMENTS

Technical Problem

Figure 1:
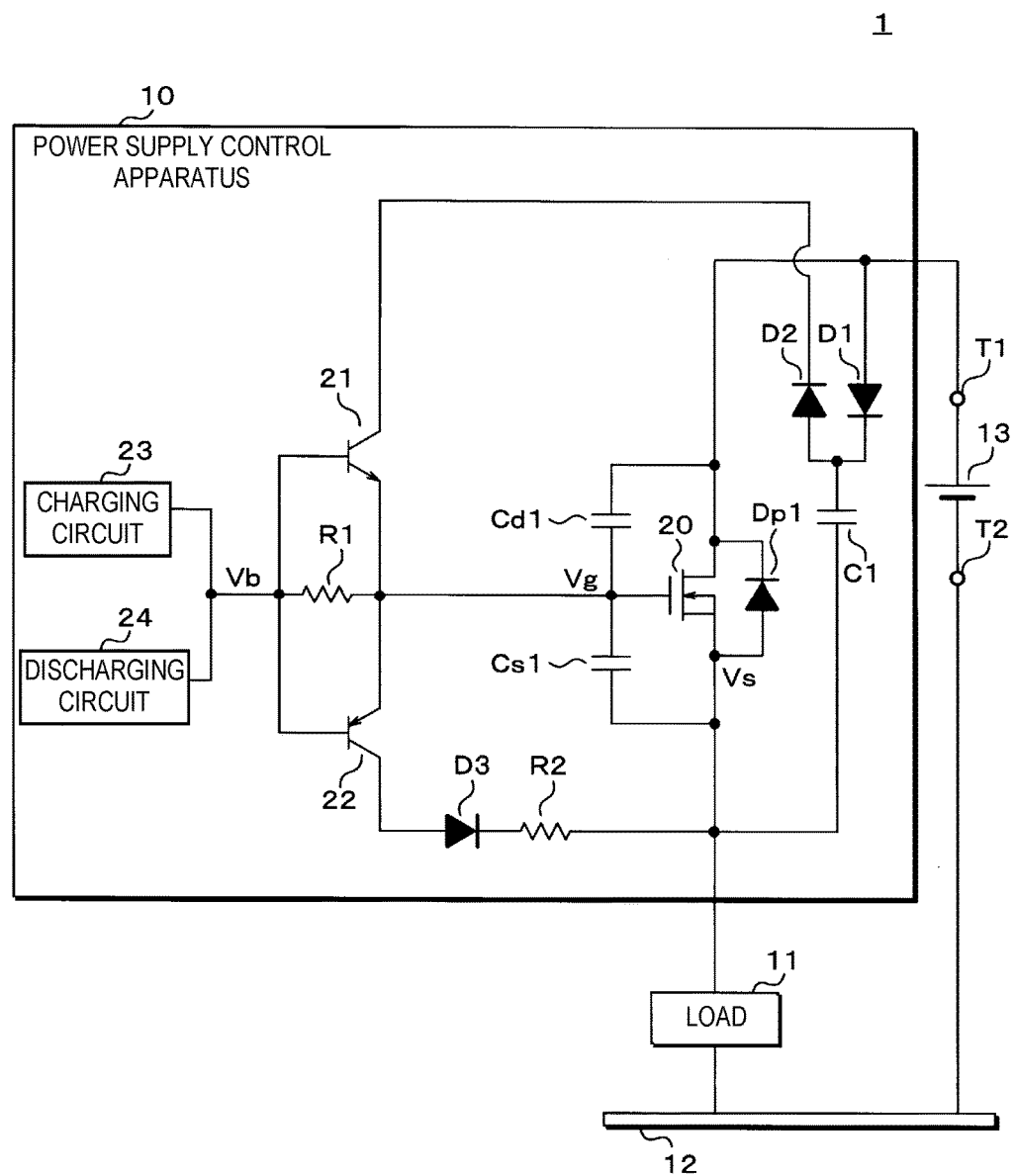
FIG. 1 is a circuit diagram of a power supply system according to Embodiment 1.

Switching loss and the frequency band of electromagnetic waves generated due to switching of the semiconductor switch differ depending on the speed at which the semiconductor switch switches from OFF to ON. In the power supply control apparatus for controlling power supply from a battery to a load, the switching speed is adjusted so that the switching loss and the frequency band of electromagnetic waves are within respective predetermined ranges. The switching speed is adjusted by changing an element used in the apparatus, such as a resistor or a capacitor, to an element with an appropriate constant.

Also, the size of the semiconductor switch that is used to control power supply differs depending on the value of the current to be supplied to the load. For example, the larger the current to be supplied to the load, the larger the size of the semiconductor switch to be used. The capacitance of the parasitic capacitor differs depending on the size of the semiconductor switch.

In the power supply control apparatus described in JP 4252091B, the speed at which the semiconductor switch switches from OFF to ON differs depending on the capacitance of the parasitic capacitor. For this reason, elements such as a resistor or a capacitor need to be changed to adjust the switching speed so that the switching loss and the frequency band of electromagnetic waves are within the respective predetermined ranges, every time the size of the semiconductor switch is changed.

A plurality of loads are mounted in a vehicle. Usually, the values of currents to be supplied to the respective loads are not the same. For this reason, if the power supply control apparatus described in JP 4252091B is used as a power supply control apparatus for controlling power supply to the plurality of loads, elements such as a resistor or a capacitor need to be selected in accordance with the loads, resulting in high development costs.

In view of the foregoing situation, a power supply control apparatus is provided that can make the speed of the switching from OFF to ON substantially fixed regardless of the capacitance of the parasitic capacitor.

Effects of Disclosure

According to this disclosure, the speed of the switching from OFF to ON can be made substantially fixed regardless of the capacitance of the parasitic capacitor.

DESCRIPTION OF EMBODIMENTS OF DISCLOSURE

First, aspects of the present disclosure will be listed and described. At least some of the following aspects may also be combined in any manner.

(1) A power supply control apparatus according to an aspect of the present disclosure is a power supply control apparatus that includes a semiconductor switch that is arranged midway in a power supply path and is ON if a voltage at a control end of the semiconductor switch is at least a threshold, the power supply control apparatus including: a second semiconductor switch that is arranged midway in the power supply path on an upstream side of the semiconductor switch, the second semiconductor switch being ON if a voltage at a control end thereof is at least a second threshold; a resistor connected between one end of the power supply path on a current input side and the control end of the second semiconductor switch; a diode having an anode connected to the control end of the semiconductor switch, and a cathode connected to the control end of the second semiconductor switch; a voltage output unit for outputting a voltage; and a switch connected between the one end of the power supply path and the control end of the semiconductor switch, wherein the switch is ON if a differential voltage obtained by subtracting the voltage at the control end of the semiconductor switch from an output voltage that is output by the voltage output unit is at least a predetermined voltage, and is OFF if the differential voltage is smaller than the predetermined voltage.

According to the above-described aspect, the semiconductor switch is arranged midway in the power supply path through which a battery supplies power to a load, for example. Electric power is supplied from the battery to a parasitic capacitor that is connected to the control end of the semiconductor switch via the switch connected between the one end of the power supply path on the current input side, i.e. a positive electrode of the battery and the control end of the semiconductor switch. Thus, the voltage at the control end is increased. When the semiconductor switch is switched ON, the output voltage that is output by the voltage output unit is increased. The switch is ON if the differential voltage obtained by subtracting the voltage at the control end from the output voltage of the voltage output unit is at least the predetermined voltage, and is OFF if the differential voltage is smaller than the predetermined voltage. For this reason, the voltage at the control end is restricted to a voltage smaller than or equal to the voltage obtained by subtracting the predetermined voltage from the output voltage of the voltage output unit. Thus, as long as the battery can increase the voltage at the control end of the semiconductor switch at a speed higher than the speed at which the output voltage of the voltage output unit increases, the speed at which the voltage at the control end of the semiconductor switch increases is substantially the same as the speed at which the output voltage of the voltage output unit increases, regardless of the capacitance of the parasitic capacitor. In other words, if the battery is configured as mentioned above, the speed at which the semiconductor switch switches from OFF to ON is substantially fixed regardless of the capacitance of the parasitic capacitor.

Also, the second semiconductor switch is arranged midway in the power supply path on the upstream side of the semiconductor switch. The second semiconductor switch is ON if the voltage at the control end is at least the second threshold. Furthermore, the resistor is connected between the one end of the power supply path on the current input side and the control end of the second semiconductor switch. The diode is connected between the control ends of the semiconductor switch and the second semiconductor switch. Here, the anode of the diode is connected to the control end of the semiconductor switch, and the cathode thereof is connected to the control end of the semiconductor switch.

(2) A power supply control apparatus according to an aspect of the present disclosure further includes: a resistor connected between an output end from which the voltage output unit outputs a voltage and the control end of the semiconductor switch.

According to the above-described aspect, after the semiconductor switch is switched ON, the voltage output unit continues to output a voltage via the resistor to keep the semiconductor switch ON.

(3) A power supply control apparatus according to an aspect of the present disclosure further includes: a capacitor connected between the one end of the power supply path and a current output end of the semiconductor switch.

According to the above-described aspect, for example, a positive electrode of a battery is connected to the one end of the power supply path on the current input side, and one end of a load is connected to the current output end of the semiconductor switch. If the semiconductor switch is OFF, the battery charges the capacitor. In this case, the voltage across the capacitor substantially coincides with the output voltage of the battery.

If the output voltage of the voltage output unit is increased to switch ON the semiconductor switch, the parasitic capacitor connected to the control end of the semiconductor switch is charged, the voltage at the control end increases, and the resistance values at a current input end and the current output end of the semiconductor switch decrease. Thus, a current flows through the load, and the voltage at the current output end increases. Since the voltage across the capacitor substantially coincides with the output voltage of the battery, the voltage at the one end of the power supply path on the current input side increases with the increase in the voltage at the current output end, and exceeds the output voltage of the battery. Thus, the voltage at the control end of the semiconductor switch can be increased at a speed that is reliably higher than the speed at which the output voltage of the voltage output unit increases.

(5) In a power supply control apparatus according to an aspect of the present disclosure, the second semiconductor switch switches OFF if a negative voltage is applied to the one end of the power supply path, with a potential at another end of the power supply path serving as a reference.

According to the above-described aspect, for example, if a positive electrode and a negative electrode of a battery are connected to the other end and the one end by mistake, the second semiconductor switch switches OFF. Thus, a backflow of a current through the power supply path is prevented reliably.

DETAILS OF EMBODIMENTS OF THE DISCLOSURE

A specific example of a power supply control apparatus according to embodiments of the present disclosure will be described below with reference to the drawings. Note that the present disclosure is not limited to these examples but is defined by the claims, and is intended to encompass all modifications made within the meaning and scope equivalent to the claims.

Embodiment 1

FIG. 1 is a circuit diagram of the power supply system 1 according to Embodiment 1. The power supply system 1 is favorably mounted in a vehicle, and includes a power supply control apparatus 10, a load 11, a conductor 12, and a battery 13. The power supply control apparatus 10 is connected to one end of the load 11 and a positive terminal T1. The other end of the load 11 and a negative terminal T2 are connected to the conductor 12. The conductor 12 is a vehicle body, for example. A positive electrode and a negative electrode of the battery 13 are connected to the positive terminal T1 and the negative terminal T2, respectively.

The battery 13 supplies power to the load 11 via the power supply control apparatus 10. In the power supply system 1, a power supply path is formed through which a current flows from the positive terminal T1 to the power supply control apparatus 10, the load 11, and the conductor 12 in this order, and then returns to the negative terminal T2. The positive terminal T1 is provided at one end of the power supply path on a current input side, and the negative terminal T2 is provided at the other end of the power supply path.

The load 11 is an electric device that is mounted in the vehicle. The load 11 operates if power is supplied to the load 11 from the battery 13. The load 11 stops operation if power supply from the battery 13 to the load 11 stops. The power supply control apparatus 10 controls the power supply from the battery 13 to the load 11.

The power supply control apparatus 10 includes a semiconductor switch 20, a first switch 21, a second switch 22, a charging circuit 23, a discharging circuit 24, a capacitor C1, diodes D1, D2, and D3, and resistors R1 and R2. The semiconductor switch 20 is an N-channel FET (Field Effect Transistor). The first switch 21 is an NPN bipolar transistor. The second switch 22 is a PNP bipolar transistor.

Parasitic capacitors Cd1 and Cs1 and a parasitic diode Dp1 are formed when the semiconductor switch 20 is manufactured. Accordingly, the power supply control apparatus 10 further includes parasitic capacitors Cd1 and Cs1 and a parasitic diode Dp1. The parasitic capacitor Cd1 is connected between a drain and a gate of the semiconductor switch 20. The parasitic capacitor Cs1 is connected between a source and the gate of the semiconductor switch 20. A cathode and an anode of the parasitic diode Dp1 are connected to the drain and the source of the semiconductor switch 20, respectively.

The drain of the semiconductor switch 20 is connected to the positive terminal T1. The source of the semiconductor switch 20 is connected to the one end of the load 11. An anode of the diode D1 is also connected to the positive terminal T1. A cathode of the diode D1 is connected to one end of the capacitor C1 and an anode of the diode D2. The other end of the capacitor C1 is connected to the source of the semiconductor switch 20. A cathode of the diode D2 is connected to a collector of the first switch 21.

The gate of the semiconductor switch 20 is connected to emitters of the first switch 21 and the second switch 22, as well as to one end of the resistor R1. A collector of the second switch 22 is connected to an anode of the diode D3. A cathode of the diode D3 is connected to one end of the resistor R2. The other end of the resistor R2 is connected to the source of the semiconductor switch 20. The bases of the first switch 21 and the second switch 22 and the other end of the resistor R1 are connected to an output end of the charging circuit 23 and an input end of the discharging circuit 24.

As described above, the collector of the first switch 21 is connected to the positive terminal T1 via the diodes D1 and D2, and the emitter of the first switch 21 is connected to the gate of the semiconductor switch 20. Accordingly, the first switch is connected between one end of the power supply path on the current input side and the gate of the semiconductor switch 20. One end of the capacitor C1 is connected to the positive terminal T1 via the diode D1, and the other end of the capacitor C1 is connected to the source of the semiconductor switch 20. Accordingly, the capacitor C1 is connected to the one end of the power supply path on the current input end and the source of the semiconductor switch 20.

As for the semiconductor switch 20, if a differential voltage obtained by subtracting the voltage VS at the source (hereinafter, "source voltage") based on the potential on the conductor 12 serving as a reference, from the voltage Vg at the gate (hereinafter, "gate voltage") based on the potential on the conductor 12 serving as a reference is at least an ON threshold, the value of resistance between the drain and the source is substantially zero Ω. In this case, the semiconductor switch 20 is ON.

If the semiconductor switch 20 is ON, the source voltage substantially coincides with the output voltage Vt of the battery 13. Accordingly, the semiconductor switch 20 is ON if the gate voltage Vg is at least a threshold that is obtained by adding the ON threshold to the output voltage of the battery 13.

Also, as for the semiconductor switch 20, if the differential voltage obtained by subtracting the source voltage Vs from the gate voltage Vg is smaller than an OFF threshold, the value of resistance between the drain and the source is sufficiently large, and no current flows between the drain and the source. In this case, the semiconductor switch 20 is OFF. The OFF threshold is a positive value, and is smaller than the ON threshold.

The gate of the semiconductor switch 20 functions as a control end.

The charging circuit 23 is used to charge the parasitic capacitors Cd1 and Cs1. When charging the parasitic capacitors Cd1 and Cs1, the charging circuit 23 outputs a voltage that is based on the conductor 12 serving as a reference, from its output end, and increases the output voltage that is being output, i.e. the voltage Vb at the bases (hereinafter, "base voltage") of the first switch 21 and the second switch 22 based on the potential of the conductor 12 serving as a reference, to a target voltage Vm (see FIG. 2). The charging circuit 23 functions as a voltage output unit.

If the parasitic capacitors Cd1 and Cs1 have been charged, the gate voltage Vg increases, and the semiconductor switch 20 switches from OFF to ON. If the semiconductor switch 20 is ON, the source voltage Vs substantially coincides with the output voltage Vt of the battery 13. For this reason, the target voltage Vm (see FIG. 2) is higher than the output voltage Vt of the output voltage 13.

If the semiconductor switch 20 is ON, power is supplied from the battery 13 to the load 11 via the semiconductor switch 20, and the load 11 operates. Thus, the semiconductor switch 20 is arranged midway in the power supply path through which the battery 13 supplies power to the load 11. The charging circuit 23 stops outputting a voltage by opening its output end therewithin. Thus, charging of the parasitic capacitors Cd1 and Cs1 stops.

If the semiconductor switch 20 is ON, a current flows through the drain and the source, in this order, of the semiconductor switch 20. Accordingly, the drain and the source of the semiconductor switch 20 function as a current input end and a current output end, respectively.

The discharging circuit 24 is used to discharge the parasitic capacitors Cd1 and Cs1. When discharging the parasitic capacitors Cd1 and Cs1, the input end of the discharging circuit 24 is connected to the conductor 12 via an internal resistor (not shown). If the parasitic capacitors Cd1 and Cs1 have been discharged, the gate voltage Vg decreases, and the semiconductor switch 20 switches from ON to OFF. If the semiconductor switch 20 is OFF, power supply from the battery 13 to the load 11 stops, and the load 11 stops operation. The discharging circuit 24 stops discharging the parasitic capacitors Cd1 and Cs1 by opening its input end therewithin.

As for the first switch 21, if a differential voltage obtained by subtracting the gate voltage Vg from the base voltage Vb is at least a first reference voltage, a current can flow between the collector and the emitter. In this case, the first switch 21 is ON. Also, as for the first switch 21, if the differential voltage obtained by subtracting the gate voltage Vg from the base voltage Vb is smaller than the first reference voltage, no current flows between the collector and the emitter. In this case, the first switch 21 is OFF. The first reference voltage is a positive, fixed voltage.

As for the second switch 22, if the differential voltage obtained by subtracting the base voltage Vb from the gate voltage Vg is at least a second reference voltage, a current can flow between the emitter and the collector. In this case, the second switch 22 is ON. Also, as for the second switch 22, if the differential voltage obtained by subtracting the base voltage Vb from the gate voltage Vg is smaller than the second reference voltage, no current flows between the emitter and the collector. In this case, the second switch 22 is OFF. The second reference voltage is a positive, fixed voltage.

If the discharging circuit 24 has completed discharging of the parasitic capacitors Cd1 and Cs1 with the charging circuit 23 stopping charging, the gate voltage Vg and the base voltage Vb are substantially zero V. In this case, the differential voltage obtained by subtracting the gate voltage Vg from the base voltage Vb is smaller than the first reference voltage, and the differential voltage obtained by subtracting the base voltage Vb from the gate voltage Vg is smaller than the second reference voltage. Accordingly, the first switch 21 and the second switch 22 are OFF. Also, since discharging the parasitic capacitor Cs1 is complete, the differential voltage obtained by subtracting the source voltage Vs from the gate voltage Vg is substantially zero V, and is smaller than the OFF threshold. Accordingly, the semiconductor switch 20 is also OFF.

If the semiconductor switch 20, the first switch 21, and the second switch 22 are OFF, a current flows from the positive electrode of the battery 13 to the capacitor C1 via the diode D1, and the capacitor C1 is charged. The capacitor C1 is charged until the voltage across the capacitor C1 substantially coincides with the output voltage Vt of the battery 13.

Figure 2:
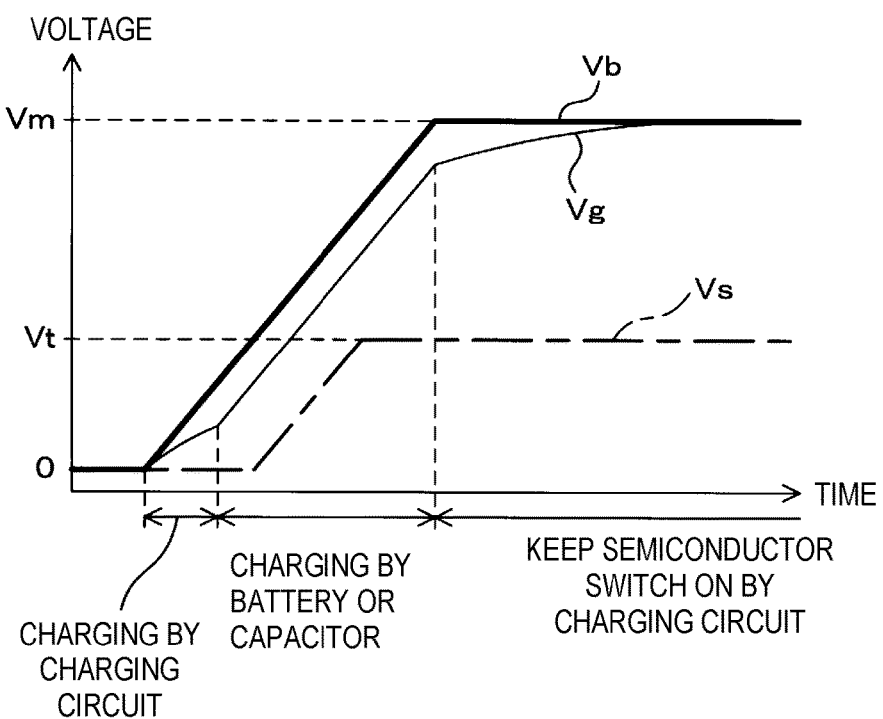

FIG. 2 is a diagram illustrating switching of the semiconductor switch 20 from OFF to ON. In FIG. 2, the runs of the base voltage Vb, the gate voltage Vg, and the source voltage Vs are indicated by a thick solid line, a thin solid line, and an alternate long and short dash line, respectively. The horizontal axis is the time axis. Thick solid lines are drawn in a portion where the base voltage Vb, the gate voltage Vg, and the source voltage Vs overlap each other, and a portion where the base voltage Vb and the gate voltage Vg overlap each other.

In the following description, the semiconductor switch 20 starts to be switched ON with the first switch 21 and the second switch 22 being OFF. First, the discharging circuit 24 opens its input end, and the charging circuit 23 increases the base voltage Vb.

If the charging circuit 23 is outputting a voltage, the base voltage Vb is at least the gate voltage Vg, and thus, the differential voltage obtained by subtracting the base voltage Vb from the gate voltage Vg is smaller than the second reference voltage, and the second switch 22 is OFF.

If the charging circuit 23 increases the base voltage Vb, initially, a current flows from the output end of the charging circuit 23 to the parasitic capacitors Cd1 and Cs1 via the resistor R1, the parasitic capacitors Cd1 and Cs1 are charged, and the gate voltage Vg increases. While the differential voltage obtained by subtracting the gate voltage Vg from the base voltage Vb is smaller than the first reference voltage, the first switch 21 is OFF, and thus, the parasitic capacitors Cd1 and Cs1 are charged by the charging circuit 23.

If the differential voltage obtained by subtracting the gate voltage Vg from the base voltage Vb is at least the first reference voltage, the first switch 21 switches ON. The output voltage of the battery 13 is sufficiently higher than the output voltage of the charging circuit 23, i.e. the base voltage Vb. Accordingly, if the first switch 21 switches ON, the parasitic capacitors Cd1 and Cs1 are rapidly charged by the battery 13.

As mentioned above, the first switch 21 is ON if the differential voltage obtained by the gate voltage Vg from the base voltage Vb is at least the first reference voltage, and is OFF if the differential voltage obtained by subtracting the gate voltage Vg from the base voltage Vb is smaller than the first reference voltage. For this reason, the gate voltage Vg is restricted to be smaller than or equal to a voltage obtained by subtracting the first reference voltage from the base voltage Vb.

The battery 13 can increase the gate voltage Vb at a speed higher than the speed at which the base voltage Vb increases. Thus, the gate voltage Vg increases at substantially the same speed as the speed at which the base voltage Vb increases.

If the differential voltage obtained by subtracting the source voltage Vs from the gate voltage Vg becomes greater than or equal to the OFF threshold for the semiconductor switch 20, a current flows from the positive electrode of the battery 13 to the load 11 via the drain and the source of the semiconductor switch 20, and a voltage is generated across the load 11. If the gate voltage Vg increases, the value of resistance between the drain and the source of the semiconductor switch 20 decreases, the current flowing through the load 11 increases, and the voltage across the load 11 increases. As a result, the source voltage Vs increases. The source voltage Vs increases with the difference between the gate voltage Vg and the source voltage Vs kept at the OFF threshold, until reaching the output voltage Vt of the battery 13.

The voltage at one end of the capacitor C1 on the diode D2 side is a voltage obtained by adding the voltage across the capacitor C1 to the source voltage Vs, with the potential on the conductor 12 serving as a reference. The voltage across the capacitor C1 substantially coincides with the output voltage Vt of the battery 13, as mentioned above. Thus, if the source voltage Vs increases, the voltage at the one end of the capacitor C1 on the diode D2 side also increases, and this voltage exceeds the output voltage Vt of the battery 13.

Accordingly, if the source voltage Vs increases, a voltage higher than that at the battery 13 is output from the capacitor C1 via the diode D2, and the parasitic capacitors Cd1 and Cs1 are charged. The diode D1 prevents a current from flowing from the capacitor C1 to the battery 13.

The capacitor C1 can also increase the gate voltage Vg at a speed higher than the speed at which the base voltage Vb increases. Thus, the gate voltage Vg also increases at substantially the same speed as the speed at which the base voltage Vb increases, while the capacitor C1 is charging the parasitic capacitors Cd1 and Cs1.

The source voltage Vs, after reaching the output voltage Vt of the battery 13, is kept at the output voltage Vt of the battery 13.

As mentioned above, the target voltage Vm of the charging circuit 23 is higher than the output voltage Vt of the battery 13, and the voltage at the one end of the capacitor C1 on the diode D2 side is higher than the output voltage Vt of the battery 13. Thus, after the source voltage Vs has reached the output voltage Vt of the battery 13, the base voltage Vb and the gate voltage Vg still increase with the difference therebetween kept at the first reference voltage.

If the differential voltage obtained by subtracting the source voltage Vs from the gate voltage Vg becomes greater than or equal to the ON threshold, the semiconductor switch 20 switches ON. The target voltage Vm is higher than a voltage obtained by adding the ON threshold for the semiconductor switch 20 and the first reference voltage for the first switch 21 to the output voltage Vt of the battery 13. Thus, the semiconductor switch 20 switches ON while the battery 13 or the capacitor C1 is charging the parasitic capacitors Cd1 and Cs1.

If the output voltage of the charging circuit 23, i.e. the base voltage Vb reaches the target voltage Vm, the charging circuit 23 continues to output the target voltage Vm. After the base voltage Vb has reached the target voltage Vm, the differential voltage obtained by subtracting the gate voltage Vg becomes smaller than the first reference voltage, switching OFF the first switch 21, and the parasitic capacitors Cd1 and Cs1 are charged by the charging circuit 23. As a result, the gate voltage Vg gradually increases to the base voltage Vb, which is kept at the target voltage Vm. After the gate voltage Vg has reached the base voltage Vb, the base voltage Vb and the gate voltage Vg are kept at the target voltage Vm as long as the charging circuit 23 outputs the target voltage Vm. The charging circuit 23 continues to output the target voltage Vm, thereby keeping the semiconductor switch 20 ON.

As described above, in the power supply control apparatus 10, the gate voltage Vg increases at substantially the same speed as the speed at which the base voltage Vb increases in a period in which the semiconductor switch 20 switches from OFF to ON, except for a period in which the charging circuit 23 charges the parasitic capacitors Cd1 and Cs1. The ratio of the period in which the charging circuit 23 charges the parasitic capacitors Cd1 and Cs1 to the period in which the semiconductor switch 20 switches from OFF to ON is very small. Accordingly, as long as the battery 13 and the capacitor C1 can increase the gate voltage Vg at a speed higher than the speed at which the base voltage Vb increases, the speed at which the semiconductor switch 20 switches from OFF to ON is substantially fixed regardless of the capacitance of the parasitic capacitors Cd1 and Cs1.

After the semiconductor switch 20 is switched ON, the charging circuit 23 continues to output the target voltage Vm via the resistor R1 to keep the semiconductor switch 20 ON.

Furthermore, if the source voltage Vs increases, the voltage at the one end of the capacitor C1 on the diode D2 side also increases, as mentioned above. Thus, the gate voltage Vg can be increased at a speed that is reliably higher than the speed at which the base voltage Vb increases.

Next, the switching of the semiconductor switch 20 from ON to OFF will be described. A description will now be given of the switching of the semiconductor switch 20 to OFF in a case where the charging circuit 23 outputs the target voltage Vm, and the base voltage Vb and the gate voltage Vg are kept at the target voltage Vm.

If the base voltage Vb and the gate voltage Vg are the target voltage Vm, the differential voltage obtained by subtracting the gate voltage Vg from the base voltage Vb is smaller than the first reference voltage, and the differential voltage obtained by subtracting the base voltage Vb from the gate voltage Vg is smaller than the second reference voltage. Thus, the first switch 21 and the second switch 22 are OFF.

As a result of the charging circuit 23 stopping outputting a voltage, and the discharging circuit 24 connecting its input end to the conductor 12 via an internal resistor, the semiconductor switch 20 starts to be switched OFF. If the charging circuit 23 stops outputting a voltage, and the input end of the discharging circuit 24 is connected to the conductor 12 via the internal resistor, a current flows from one end of the parasitic capacitors Cd1 and Cs1 on the gate side, through the resistor R1 and the internal resistor of the discharging circuit 24 in this order, and the resistor R1 and the internal resistor of the discharging circuit 24 divide the gate voltage Vg. The base voltage Vb is a voltage that is divided by the resistor R1 and the internal resistor of the discharging circuit 24.

The resistance values of the resistor R1 and the internal resistor of the discharging circuit 24 are fixed. For this reason, the base voltage Vb is 1/(a specific number) of the gate voltage Vg. For example, if the resistance values of the resistor R1 and the internal resistor of the discharging circuit 24 are the same, the base voltage Vb is half the gate voltage Vg.

If the input end of the discharging circuit 24 is connected to the conductor 12 via the internal resistor, the gate voltage Vg is at least the base voltage Vb, and thus, the differential voltage obtained by subtracting the gate voltage Vg from the base voltage Vb is smaller than the first reference voltage, and the first switch 21 is OFF.

Needless to say, the higher the gate voltage Vg, the higher the differential voltage obtained by subtracting the base voltage Vb from the gate voltage Vg. In a case where the specific value is 3, when the gate voltage Vg is 30V, the differential voltage obtained by subtracting the base voltage Vb from the gate voltage Vg is 20 V (=30−(30/3)). In the same case, when the gate voltage Vg is 15V, the differential voltage obtained by subtracting the base voltage Vb from the gate voltage Vg is 10 V (=15−(15/3)).

At a point in time when the discharging circuit 24 connects its input end to the conductor 12 via the internal resistor, the gate voltage Vg is the target voltage Vm, and is highest. For this reason, the differential voltage obtained by subtracting the base voltage Vb from the gate voltage Vg is at least the second reference voltage, and the second switch 22 switches ON.

If the second switch 22 is ON, a current flows from one end of the parasitic capacitor Cs1 on the gate side, through the diode D3 and the resistor R2 in this order, and then returns to one end of the parasitic capacitor Cs1 on the source side, and the parasitic capacitor Cs1 is discharged. Furthermore, if the second switch 22 is ON, a current flows from one end of the parasitic capacitor Cd1 on the gate side, through the diode D3, the resistor R2, and the parasitic diode Dp1 in this order, and the parasitic capacitor Cd1 is also discharged. The resistance value of the resistor R2 is sufficiently smaller than the sum of the resistance values of the resistor R1 and the internal resistor of the discharging circuit 24. For this reason, if the second switch 22 is ON, a large amount of electric power is discharged by the parasitic capacitors Cs1 and Cd1, and the gate voltage Vg rapidly drops.

If the gate voltage Vg drops, the differential voltage obtained by subtracting the base voltage Vb from the gate voltage Vg also drops, as mentioned above. If the differential voltage obtained by subtracting the base voltage Vb from the gate voltage Vg becomes smaller than the second reference voltage, the second switch 22 switches OFF. After the second switch 22 has switched OFF, the parasitic capacitors Cd1 and Cs1 are discharged via the resistor R1 and the internal resistor of the discharging circuit 24 until the gate voltage Vg and the base voltage Vb become substantially zero V.

If the gate voltage Vg drops, the value of resistance between the drain and the source of the semiconductor switch 20 increases, and the current flowing through the load 11 drops. As a result, the source voltage Vs also drops. If the differential voltage obtained by subtracting the source voltage Vs from the gate voltage Vg becomes smaller than the OFF threshold, no current flows through the load 11, the semiconductor switch 20 switches OFF, and the source voltage Vs becomes zero V.

The voltage at the one end of the capacitor C1 on the diode D2 side drops with the drop of the source voltage Vs. If this voltage has become lower than the output voltage Vt of the battery 13, the battery 13 again charges the capacitor C1. As mentioned above, the source voltage Vs becomes zero V, and thus, the battery 13 charges the capacitor C1 until the voltage across the capacitor C1 becomes equal to the output voltage Vt of the battery 13.

In the power supply control apparatus 10, if the differential voltage obtained by subtracting the base voltage Vb from the gate voltage Vg is at least the second reference voltage, the parasitic capacitors Cd1 and Cs1 are discharged via the diode D3 and the resistor R2, and thus, the gate voltage Vg rapidly drops. For this reason, the semiconductor switch 20 switches from ON to OFF at high speed.

Embodiment 2

Figure 3:
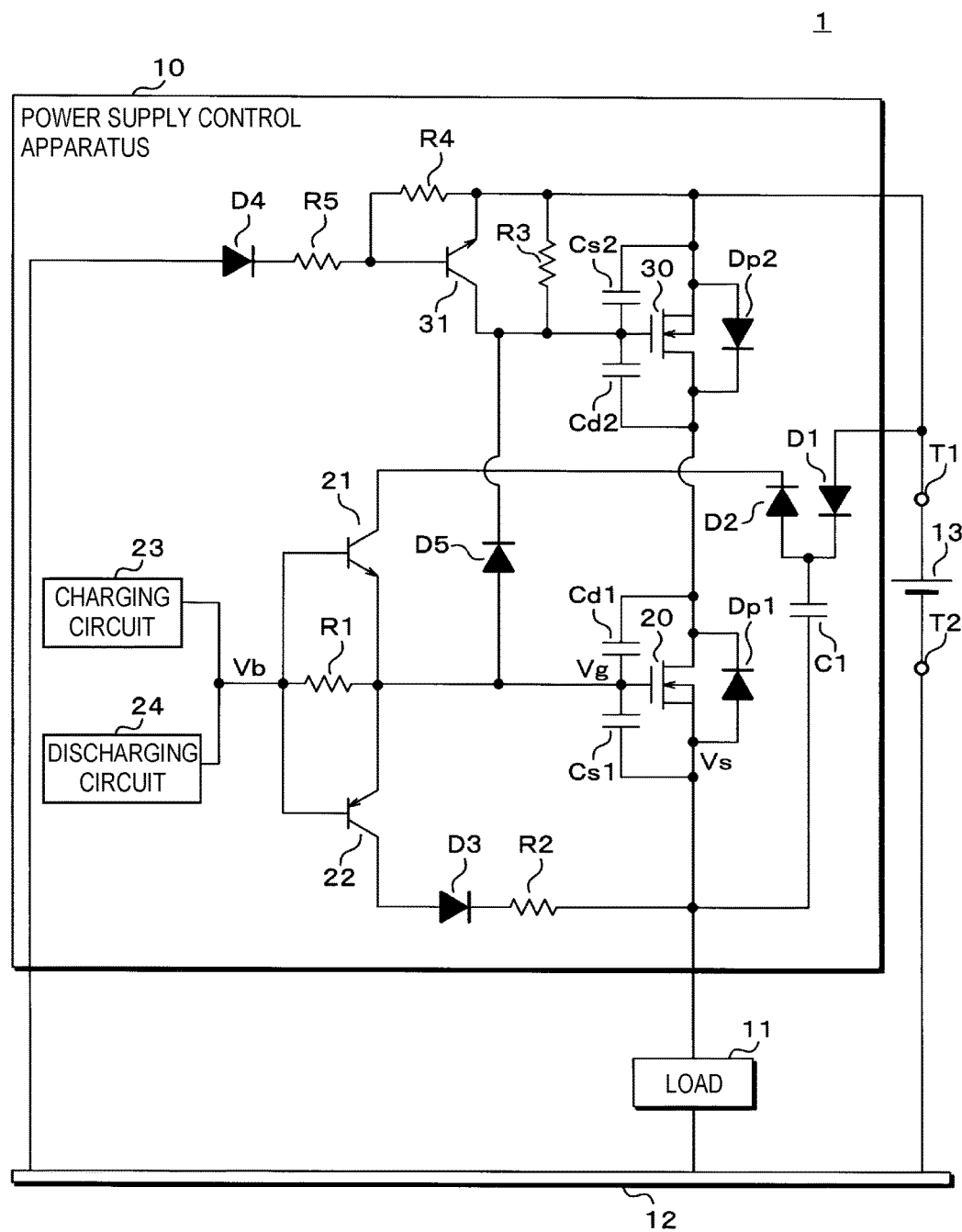
FIG. 3 is a circuit diagram of a power supply system according to Embodiment 2.

FIG. 3 is a circuit diagram of the power supply system 1 according to Embodiment 2.

In the following description, Embodiment 2 will be described regarding differences from Embodiment 1. Since the constituent elements other than those described below are the same as the constituent elements in Embodiment 1, the same constituent portions as those in Embodiment 1 are assigned the same reference signs as those in Embodiment 1 and their description is omitted.

In the power supply system 1 according to Embodiment 2, the configuration of the power supply control apparatus 10 differs from that of the power supply system 1 according to Embodiment 1. The power supply control apparatus according to Embodiment 2 includes all of the constituent portions of the power supply control apparatus 10 according to Embodiment 1, and these constituent portions are connected in the same manner as that in Embodiment 1, except for connection of the drain of the semiconductor switch 20.

The power supply control apparatus 10 according to Embodiment 2 further includes a semiconductor switch 30, a third switch 31, a diode D4, and resistors R3, R4, and R5. The semiconductor switch 30 is an N-channel FET. The third switch 31 is an NPN bipolar transistor.

Parasitic capacitors Cd2 and Cs2 and a parasitic diode Dp2 are formed when the semiconductor switch 30 is manufactured. Accordingly, the power supply control apparatus 10 according to Embodiment 2 further includes the parasitic capacitors Cd2 and Cs2 and the parasitic diode Dp2. The parasitic capacitor Cd2 is connected between a drain and a gate of the semiconductor switch 30. The parasitic capacitor Cs2 is connected between a source and the gate of the semiconductor switch 30. A cathode and an anode of the parasitic diode Dp2 are connected to the drain and the source of the semiconductor switch 30, respectively.

The source of the semiconductor switch 30 is connected to the positive terminal T1. The drain of the semiconductor switch 30 is connected to the drain of the semiconductor switch 20. An emitter of the third switch 31 and one end of each of the resistors R3 and R4 are also connected to the source of the semiconductor switch 30. A collector of the third switch 31, a cathode of the diode D5, and the other end of the resistor R3 are connected to the gate of the semiconductor switch 30. An anode of the diode D5 is connected to the gate of the semiconductor switch 20. Accordingly, the gate of the semiconductor switch 30 is connected to the gate of the semiconductor switch 20 via the diode D5.

A base of the third switch 31 is connected to the other end of the resistor R4 and one end of the resistors R5. The other end of the resistor R5 is connected to a cathode of the diode D4. An anode of the diode D4 is connected to the conductor 12.

As for the semiconductor switch 30, if a differential voltage obtained by subtracting the voltage at the source based on the potential on the conductor 12 serving as a reference, from the voltage at the gate based on the potential on the conductor 12 serving as a reference is at least a second ON threshold, the value of resistance between the drain and the source is substantially zero Ω. In this case, the semiconductor switch 30 is ON.

Also, as for the semiconductor switch 30, if the differential voltage obtained by subtracting the voltage at the source based on the potential on the conductor 12 serving as a reference, from the voltage at the gate based on the potential at the conductor 12 serving as a reference is smaller than a second OFF threshold, the value of resistance between the drain and the source is sufficiently large, and no current flows between the source and the drain. In this case, the semiconductor switch 30 is OFF. The second OFF threshold has a positive value, and is smaller than the second ON threshold.

As for the third switch 31, if the voltage at the base based on the potential at the emitter serving as a reference is at least a third reference voltage, a current can flow between the collector and the emitter. In this case, the third switch 31 is ON. Also, as for the third switch 31, if the voltage at the base based on the potential at the emitter serving as a reference is smaller than the third reference voltage, no current flows between the collector and the emitter. In this case, the third switch 31 is OFF. The third reference voltage is a positive, fixed voltage.

The voltage at the source of the semiconductor switch 30 based on the potential on the conductor 12 serving as a reference is fixed to the output voltage Vt of the battery 13. For this reason, if the third switch 31 is OFF, the semiconductor switch 30 is ON when the voltage at the gate of the semiconductor switch 30 based on the potential on the conductor 12 serving as a reference is at least a threshold, which is obtained by adding the second ON threshold to the output voltage Vt of the battery 13. This threshold corresponds to a second threshold. Furthermore, if the third switch 31 is OFF, the semiconductor switch 30 is OFF when the voltage at the gate of the semiconductor switch 30 based on the potential on the conductor 12 serving as a reference is smaller than a threshold, which is obtained by adding the second OFF threshold to the output voltage Vt of the battery 13.

As described above, if the third switch 31 is OFF, the semiconductor switch 30 can be switched ON or OFF by adjusting the voltage at the gate of the semiconductor switch 30 based on the potential on the conductor 12 serving as a reference. The gate of the semiconductor switch 30 also functions as a control end.

If the third switch 31 is ON, the voltage at the gate of the semiconductor switch 30 based on the potential at the source serving as a reference is substantially zero V, and is smaller than the second OFF threshold. Accordingly, if the third switch 31 is ON, the semiconductor switch 30 is OFF.

The battery 13 is removably connected between the positive terminal T1 and the negative terminal T2. In a normal connection state of the battery 13, the positive electrode and the negative electrode of the battery 13 are connected to the positive terminal T1 and the negative terminal T2, respectively. In an incorrect connection state of the battery 13, the positive electrode and the negative electrode of the battery 13 are connected to the negative terminal T2 and the positive terminal T1, respectively.

If the battery 13 is normally connected, no current flows through the resistors R4 and R5 due to the effect of the diode D4. In this case, the voltage at the base of the third switch 31 based on the potential at the emitter serving as a reference is substantially zero V and is smaller than the third reference voltage, and the third switch 31 is OFF. If the third switch 31 is OFF, the semiconductor switch 30 switches ON or OFF in accordance with the voltage at its gate based on the potential on the conductor 12 serving as a reference, as mentioned above.

In a case where the battery 13 is normally connected, the battery 13 supplies power to the load 11 and the load 11 operates when the semiconductor switches 20 and 30 are ON. In the same case, the battery 13 stops supplying power to the load 11 and the load 11 stops operation when the semiconductor switches 20 and 30 are OFF.

In Embodiment 2 as well, the positive terminal T1 is provided at one end, on the current input side, of the power supply path from the battery 13 to the load 11, and the negative terminal T2 is provided at the other end of the power supply path. Also, if the semiconductor switches 20 and 30 are ON, a current flows through the semiconductor switches 30 and 20 in this order, and thus, the semiconductor switch 30 is arranged on the upstream side of the semiconductor switch 20 midway in the power supply path. The semiconductor switch 30 functions as a second semiconductor switch.

If the battery 13 is incorrectly connected, i.e. if a negative voltage is applied to one end of the power supply path, with the potential at the other end of the power supply path serving as a reference, a current flows from the negative terminal T2 through the conductor 12, the diode D4, and the resistors R5 and R4 in this order, and returns to the positive terminal T1. In this case, the voltage drops at the resistor R4, and the voltage at the base of the third switch 31 based on the potential at the emitter serving as a reference becomes greater than or equal to the third threshold. As a result, the third switch 31 switches ON, and the semiconductor switch 30 switches OFF. As mentioned above, the anode of the parasitic diode Dp2 is connected to the positive terminal T1. Accordingly, if the battery 13 is incorrectly connected, no current flows through the positive terminal T1 from the negative terminal T2 via the load 11 as long as the semiconductor switch 30 is OFF, regardless of whether or not the semiconductor switch 20 is ON. Also, even if the battery 13 is incorrectly connected, with the semiconductor switches 20 and 30 being ON, the semiconductor switch 30 forcibly switches OFF. Accordingly, a current is reliably prevented from flowing through the positive terminal T1 from the negative terminal T2 via the load 11.

In the following description, the power supply control apparatus 10 in a case where the battery 13 is correctly connected will be described. In the power supply control apparatus 10, in a case where the charging circuit 23 opens its output end therewithin, and the discharging circuit 24 connects its input end to the conductor 12 via the internal resistor, the parasitic capacitors Cd1 and Cs1 are discharged in the same manner as in Embodiment 1. In the same case, the parasitic capacitors Cd2 and Cs2 are discharged via the resistor R3. If the parasitic capacitors Cd2 and Cs2 have completed discharging, the voltage at the source, drain, and gate of the semiconductor switch 30 substantially coincides with the output voltage Vt of the battery 13. To simplify the description, a voltage drop at the parasitic diode Dp2 in the forward direction is assumed to be substantially zero V.

As a result of the discharging circuit 24 opening its input end, and the charging circuit 23 increasing the base voltage Vb, the semiconductor switches 20 and 30 switch ON. At a point in time when the charging circuit 23 starts increasing the base voltage Vb, the voltage at the gate of the semiconductor switch 30 based on the potential on the conductor 12 serving as a reference substantially coincides with the output voltage Vt of the battery 13. For this reason, the voltage at the gate of the semiconductor switch 30 based on the potential on the conductor 12 serving as a reference is kept at the output voltage Vt of the battery 13, until the gate voltage Vg of the semiconductor switch 20 exceeds the output voltage Vt of the battery 13.

If the charging circuit 23 increases the base voltage Vb, initially, a current flows through the parasitic capacitor Cs1 from the output end of the charging circuit 23 via the resistor R1, the parasitic capacitor Cs1 is charged, and the gate voltage Vg of the semiconductor switch 20 increases. The first switch 21 is OFF while the differential voltage obtained by subtracting the gate voltage Vg from the base voltage Vb is smaller than the first reference voltage, and thus, the parasitic capacitor Cs1 is charged by the charging circuit 23.

If the charging circuit 23 is outputting a voltage, the second switch 22 is OFF, similarly to Embodiment 1.

If the differential voltage obtained by subtracting the gate voltage Vg from the base voltage Vb becomes greater than or equal to the first reference voltage, the first switch 21 switches ON, and the parasitic capacitor Cs1 is rapidly charged by the battery 13, similarly to Embodiment 1. In Embodiment 2 as well, the battery 13 can increase the gate voltage Vg at a speed higher than the speed at which the base voltage Vb increases. For this reason, the gate voltage Vg increases at substantially the same speed as the speed at which the base voltage Vb increases.

If the differential voltage obtained by subtracting the source voltage Vs from the gate voltage Vg becomes greater than or equal to the OFF threshold for the semiconductor switch 20, a current starts flowing through the load 11, and the source voltage Vs also increases with the increase in the gate voltage Vg, similarly to Embodiment 1. The source voltage Vs increases with the difference between the gate voltage Vg and the source voltage Vs kept at the OFF threshold, until reaching the output voltage Vt of the battery 13. If the source voltage Vs increases, the voltage at the one end of the capacitor C1 on the diode D2 side also increases, and becomes higher than the output voltage Vt of the battery 13, similarly to Embodiment 1.

In a case where the source voltage Vs increases, when the gate voltage Vg is smaller than the output voltage Vt of the battery 13, a voltage higher than the output voltage Vt of the battery 13 is output from the one end of the capacitor C1 on the diode D2 side via the diode D2, and the parasitic capacitors Cd1 and Cs1 are charged. In the same case, when the gate voltage Vg is at least the output voltage Vt of the battery 13, a voltage higher than the output voltage Vt of the battery 13 is output from the one end of the capacitor C1 on the diode D2 side via the diode D2, and the parasitic capacitors Cd1, Cs1, Cd2, and Cs2 are charged. The diode D1 prevents a current from flowing through the battery 13 from the capacitor C1.

The capacitor C1 can also increase the gate voltage Vg at a speed higher than the speed at which the base voltage Vb increases. For this reason, the gate voltage Vg also increases at substantially the same speed as the speed at which the base voltage Vb increases, while the capacitor C1 is charging the parasitic capacitors Cd1 and Cs1 or the parasitic capacitors Cd1, Cs1, Cd2, and Cs2. After the differential voltage obtained by subtracting the gate voltage Vg from the base voltage Vb has become greater than or equal to the first reference voltage, the base voltage Vb and the gate voltage Vg increase with the difference between the base voltage Vb and the gate voltage Vg kept at the first reference voltage.

The source voltage Vs, after reaching the output voltage Vt of the battery 13, is kept at the output voltage Vt of the battery 13 Even after the source voltage Vs has reached the output voltage Vt of the battery 13, the base voltage Vb and the gate voltage Vg increases with the difference therebetween kept at the first reference voltage.

If the differential voltage obtained by subtracting the source voltage Vs from the gate voltage Vg becomes greater than or equal to the ON threshold, the semiconductor switch 20 switches ON, similarly to Embodiment 1. The target voltage Vm is higher than a voltage obtained by adding the ON threshold for the semiconductor switch 20 and the first reference voltage for the first switch 21 to the output voltage Vt of the battery 13. For this reason, the semiconductor switch 20 switches ON while the battery 13 or the capacitor C1 is charging the parasitic capacitors Cd1, Cs1, Cd2, and Cs2.

If the differential voltage obtained by subtracting the voltage at the source of the semiconductor switch 30 from the voltage at the gate becomes greater than or equal to the second ON threshold, semiconductor switch 30 switches ON. The target voltage Vm is higher than a voltage obtained by adding the second ON threshold for the semiconductor switch 30 and the first reference voltage for the first switch 21 to the output voltage Vt of the battery 13. For this reason, the semiconductor switch 30 switches ON while the battery 13 or the capacitor C1 is charging the parasitic capacitors Cd1, Cs1, Cd2, and Cs2.

If the output voltage of the charging circuit 23, i.e. the base voltage Vb has reached the target voltage Vm, the charging circuit 23 continues to output the target voltage Vm, similarly to Embodiment 1. After the base voltage Vb has reached the target voltage Vm, the differential voltage obtained by subtracting the gate voltage Vg from the base voltage Vb becomes smaller than the first reference voltage, switching OFF the first switch 21, and the parasitic capacitors Cd1, Cs1, Cd2, and Cs2 are charged by the charging circuit 23. Thus, the gate voltage Vg of the semiconductor transistor 20 and the voltage at the gate of the semiconductor switch 30 gradually increase to the base voltage Vb that is kept at the target voltage Vm. To simplify the description, a voltage drop at the diode D5 in the forward direction is assumed to be substantially zero V.

After the gate voltage Vg of the semiconductor switch 20 and the voltage at the gate of the semiconductor switch 30 have reached the base voltage Vb, the base voltage Vb, the gate voltage Vg of the semiconductor switch 20, and the voltage at the gate of the semiconductor switch 30 are kept at the target voltage Vm, as long as the charging circuit 23 outputs the target voltage Vm. The charging circuit 23 continues to output the target voltage Vm, thereby keeping the semiconductor switches 20 and 30 ON.

As described above, in the power supply control apparatus 10, the gate voltage Vg of the semiconductor switch 20 and the voltage at the gate of the semiconductor switch 30 increase at substantially the same speed as the speed at which the base voltage Vb increases in a period in which the semiconductor switches 20 and 30 switch from OFF to ON, except for a period in which the charging circuit 23 charges the parasitic capacitor Cs1.

The ratio of the period in which the charging circuit 23 charges the parasitic capacitor Cs1 to the period in which the semiconductor switch 20 switches from OFF to ON is very small. For this reason, as long as the battery 13 and the capacitor C1 can increase the gate voltage Vg of the semiconductor switch 20 and the voltage at the gate of the semiconductor switch 30 at a speed higher than the speed at which the base voltage Vb is increased, the speed at which the semiconductor switches 20 and 30 switch from OFF to ON is substantially fixed regardless of the capacitance of the parasitic capacitors Cd1, Cs1, Cd2, and Cs2.

After the semiconductor switches 20 and 30 are switched ON, the charging circuit 23 continues to output the target voltage Vm, via the resistor R1 to keep the semiconductor switches 20 and 30 ON.

Furthermore, if the source voltage Vs increases, the voltage at the one end of the capacitor C1 on the diode D2 side also increases, and accordingly, the gate voltage Vg can be increased at a speed that is reliably higher than the speed at which the base voltage Vb increases, similarly to Embodiment 1.

Next, a description will be given of the switching of the semiconductor switches 20 and 30 to OFF in a case where the charging circuit 23 outputs the target voltage Vm, and the base voltage Vb, the gate voltage Vg of the semiconductor switch 20, and the voltage at the gate of the semiconductor switch 30 are kept at the target voltage Vm.

If the base voltage Vb and the gate voltage Vg are the target voltage Vm, the first switch 21 and the second switch 22 are OFF, as described in Embodiment 1.

In Embodiment 2 as well, as a result of the charging circuit 23 stopping outputting a voltage, and the discharging circuit 24 connecting its input end to the conductor 12 via the internal resistor, the semiconductor switches 20 and 30 start to be switched OFF.

The parasitic capacitors Cd1 and Cs1 are discharged similarly to Embodiment 1, and the semiconductor switch 20 rapidly switches OFF. The parasitic capacitor Cd2 is discharged via the resistor R3 and the parasitic diode Dp2, and the parasitic capacitor Cs2 is discharged via the resistor R3. Thus, the voltages at the source and the gate of the semiconductor switch 30 become equal to the output voltage Vt of the battery 13, and the semiconductor switch 30 switches OFF.

In Embodiment 2, the third switch 31 need only be a switch that is ON when the battery 13 is correctly connected, and is OFF when the battery 13 is incorrectly connected. For this reason, the third switch 31 is not limited to an NPN bipolar transistor, and may also be an N-channel FET, for example.

Embodiment 3

Figure 4:
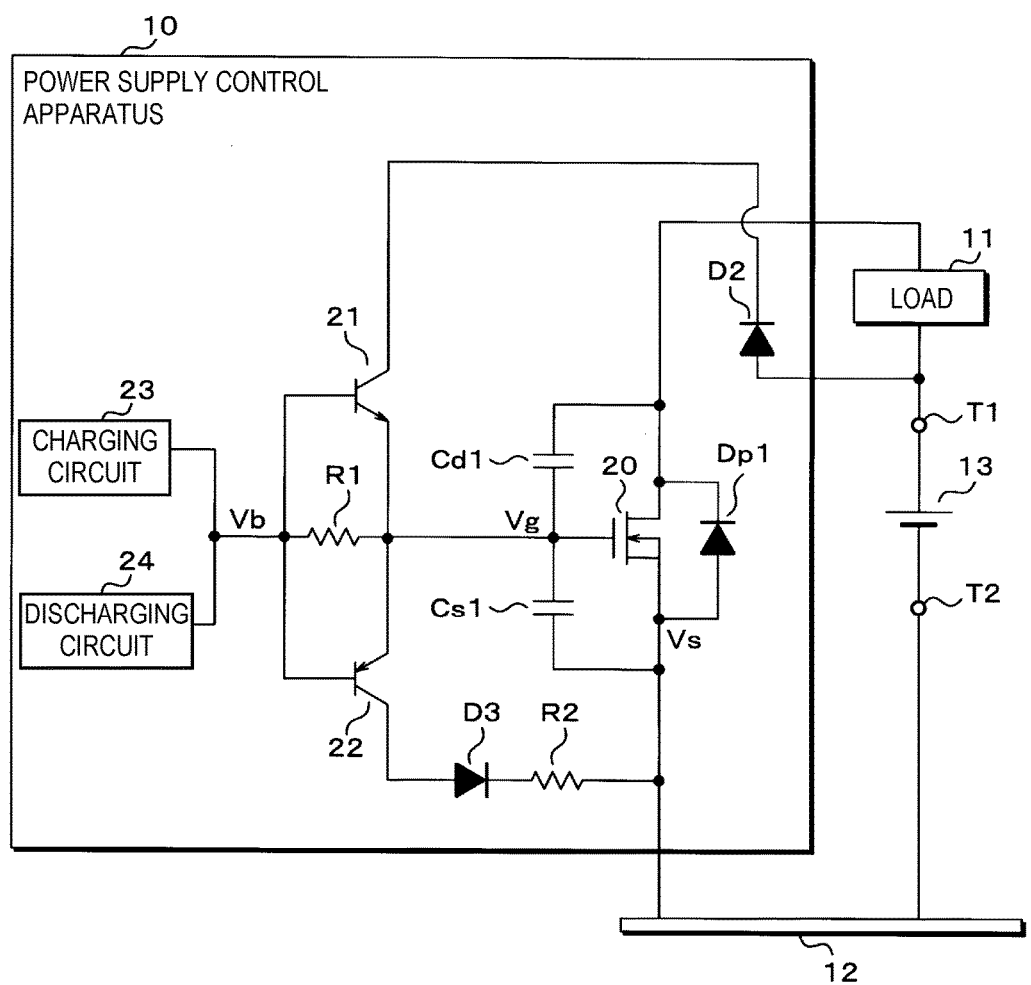
FIG. 4 is a circuit diagram of a power supply system according to Embodiment 3.

FIG. 4 is a circuit diagram of the power supply system 1 according to Embodiment 3.

In the following description, Embodiment 3 will be described regarding differences from Embodiment 1. Since the constituent elements other than those described below are the same as the constituent elements in Embodiment 1, the same constituent portions as those in Embodiment 1 are assigned the same reference signs as those in Embodiment 1 and their description is omitted.

In the power supply system 1 according to Embodiment 3, the positive terminal T1 is connected to one end of the load 11. The negative terminal T2 is connected to the conductor 12, similarly to Embodiment 1. The power supply control apparatus 10 is connected to the positive terminal T1, the other end of the load 11, and the conductor 12. In Embodiment 3 as well, the battery 13 supplies power to the load 11. In the power supply system 1 according to Embodiment 3, a power supply path is formed through which a current flows from the positive terminal T1 through the load 11, the power supply control apparatus 10, and the conductor 12 in this order, and returns to the negative terminal T2. The positive terminal T1 is provided at one end of the power supply path on a current input side, and the negative terminal T2 is provided at the other end of the power supply path. The power supply control apparatus 10 controls power supply from the battery 13 to the load 11.

The power supply control apparatus 10 according to Embodiment 3 includes the semiconductor switch 20, the first switch 21, the second switch 22, the charging circuit 23, the discharging circuit 24, the parasitic capacitors Cs1 and Cd1, the diodes D2 and D3, the parasitic diode Dp1, and the resistors R1 and R2, similarly to the power supply control apparatus 10 according to Embodiment 1. These are connected similarly to Embodiment 1, except for connection of the drain and the source of the semiconductor switch 20 and the anode of the diode D2. The drain of the semiconductor switch 20 is connected to the other end of the load 11. The source of the semiconductor switch 20 is connected to the conductor 12. The anode of the diode D2 is connected to the positive terminal T1.

In the power supply control apparatus 10 according to Embodiment 3, the source voltage Vs is fixed to substantially zero V, and does not increase. For this reason, the semiconductor switch 20 can be kept ON even if the gate voltage Vg is smaller than the output voltage Vt of the battery 13.

Figure 5:
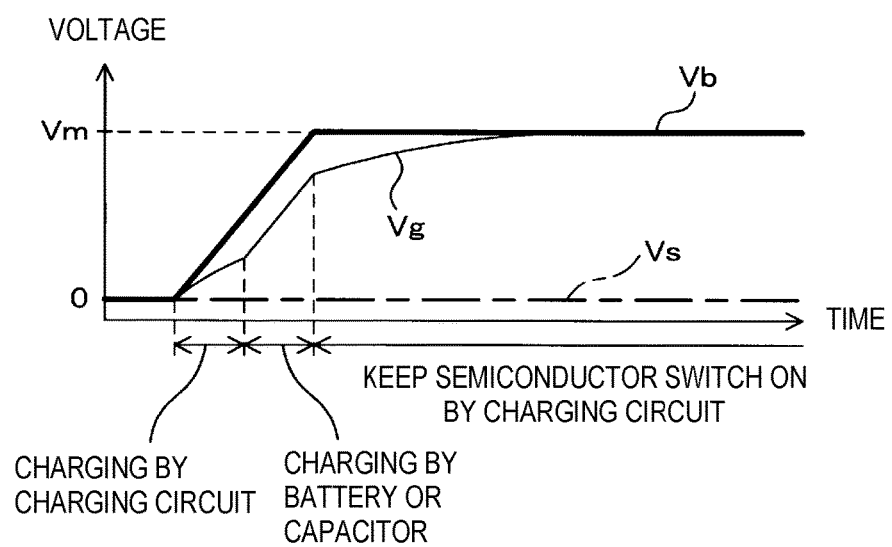

FIG. 5 is a diagram illustrating switching of the semiconductor switch 20 from OFF to ON. In FIG. 5, the runs of the base voltage Vb, the gate voltage Vg, and the source voltage Vs are indicated by a thick solid line, a thin solid line, and an alternate long and short dash line, respectively. The horizontal axis is the time axis. Thick solid lines are drawn in a portion where the base voltage Vb, the gate voltage Vg, and the source voltage Vs overlap each other, and a portion where the base voltage Vb and the gate voltage Vg overlap each other. The source voltage Vs is always substantially zero V, as mentioned above.

If the discharging circuit 24 connects its input end to the conductor 12 via the internal resistor, and the charging circuit 23 opens its output end therewithin, when the parasitic capacitors Cd1 and Cs1 has completed discharging, the base voltage Vb and the gate voltage Vg are substantially zero V, and the first switch 21 and the second switch 22 are OFF, similarly to Embodiment 1.

When the semiconductor switch 20 is switched from OFF to ON, the discharging circuit 24 opens its input end, and the charging circuit 23 increases the base voltage Vb, similarly to Embodiment 1. While the differential voltage obtained by subtracting the gate voltage Vg from the base voltage Vb is smaller than the first reference voltage for the first switch 21, the first switch 21 is OFF, and the parasitic capacitors Cd1 and Cs1 are charged by the charging circuit 23, similarly to Embodiment 1. If the charging circuit 23 is outputting a voltage, the second switch 22 is OFF, similarly to Embodiment 1.

If the differential voltage obtained by subtracting the gate voltage Vg from the base voltage Vb becomes greater than or equal to the first reference voltage, the first switch 21 switches ON, and the battery 13 charges the parasitic capacitors Cd1 and Cs1 via the diode D2 and the first switch 21. Similarly to Embodiment 1, since the battery 13 can increase the gate voltage Vg at a speed higher than the speed at which the base voltage Vb is increased, the gate voltage Vg increases at substantially the same speed as the speed at which the base voltage Vb increases, with the difference between the gate voltage Vg and the base voltage Vb kept at the first reference voltage.

If the gate voltage Vg becomes greater than or equal to the ON threshold, the semiconductor switch 20 switches ON. The target voltage Vm is higher than a voltage obtained by adding the first reference voltage for the first switch 21 to the ON threshold for the semiconductor switch 20. For this reason, the semiconductor switch 20 switches ON while the battery 13 is charging the parasitic capacitors Cd1 and Cs1.

If the output voltage of the charging circuit 23, i.e. the base voltage Vb has reached the target voltage Vm, the charging circuit 23 continues to output the target voltage Vm. After the base voltage Vb has reached the target voltage Vm, the differential voltage obtained by subtracting the gate voltage Vg from the base voltage Vb becomes smaller than the first reference voltage, switching OFF the first switch 21, and the parasitic capacitors Cd1 and Cs1 are charged by the charging circuit 23. As a result, the gate voltage Vg gradually increases to the base voltage Vb, which is kept at the target voltage Vm. After the gate voltage Vg has reached the base voltage Vb, the base voltage Vb and the gate voltage Vg are kept at the target voltage Vm as long as the charging circuit 23 outputs the target voltage Vm. The charging circuit 23 continues to output the target voltage Vm, thereby keeping the semiconductor switch 20 ON.

As described above, in the power supply control apparatus 10, the gate voltage Vg increases at substantially same speed as the speed at which the base voltage Vb increases in a period in which the semiconductor switch 20 switches from OFF to ON, except for a period in which the charging circuit 23 charges the parasitic capacitors Cd1 and Cs1. The ratio of the period in which the charging circuit 23 charges the parasitic capacitors Cd1 and Cs1 to the period in which the semiconductor switch 20 switches from OFF to ON is very small. For this reason, as long as the battery 13 and the capacitor C1 can increase the gate voltage Vg at a speed higher than the speed at which the base voltage Vb increases, the speed at which the semiconductor switch 20 switches from OFF to ON is substantially fixed regardless of the capacitance of the parasitic capacitors Cd1 and Cs1.

After the semiconductor switch 20 is switched ON, the charging circuit 23 continues to output the target voltage Vm via the resistor R1 to keep the semiconductor switch 20 ON.

Furthermore, if the source voltage Vs increases, the voltage at the one end of the capacitor C1 on the diode D2 side also increases, and accordingly, the gate voltage Vg can be increased at a speed that is reliably higher than the speed at which the base voltage Vb increases.

In the power supply control apparatus 10 according to Embodiment 3, the semiconductor switch 20 switches from ON to OFF as a result of the charging circuit 23 stopping outputting a voltage, and the discharging circuit 24 connecting its input end to the conductor 12 via the internal resistor, similarly to Embodiment 1. In this case, the ON/OFF state of the base voltage Vb, the gate voltage Vg, the first switch 21, and the second switch 22 transitions similarly to Embodiment 1.

Note that, in Embodiments 1 to 3, the first switch 21 need only be a switch that is ON when the differential voltage obtained by subtracting the gate voltage Vg from the voltage at the output end of the charging circuit 23 is at least the first reference voltage, and that is OFF when the differential voltage obtained by subtracting the gate voltage Vg from the voltage at the output end of the charging circuit 23 is smaller than the first reference voltage. For this reason, the first switch 21 is not limited to an NPN bipolar transistor, and may also be an N-channel FET, for example.

The second switch 22 need only be a switch that is ON when the differential voltage obtained by subtracting the voltage at the input end of the discharging circuit 24 from the gate voltage Vg is at least the second reference voltage, and that is OFF when the differential voltage obtained by subtracting the voltage at the input end of the discharging circuit 24 from the gate voltage Vg is smaller than the second reference voltage. For this reason, the second switch 22 is not limited to a PNP bipolar transistor, and may also be a P-channel FET.

Embodiments 1 to 3 that have been disclosed above are examples in all aspects, and should be considered to be not restrictive. The scope of the present disclosure is indicated not by the above description but by the claims, and is intended to include all modifications that are made within the meaning and scope equivalent to the claims.

The invention claimed is:

1. A power supply control apparatus that includes a semiconductor switch that is arranged midway in a power supply path and is ON if a voltage at a control end of the semiconductor switch is at least a threshold, the power supply control apparatus comprising:
a second semiconductor switch that is arranged midway in the power supply path on an upstream side of the semiconductor switch, the second semiconductor switch being ON if a voltage at a control end thereof is at least a second threshold;
a resistor connected between one end of the power supply path on a current input side and the control end of the second semiconductor switch;
a diode having an anode connected to the control end of the semiconductor switch, and a cathode connected to the control end of the second semiconductor switch;
a voltage output unit for outputting a voltage; and
a switch connected between the one end of the power supply path and the control end of the semiconductor switch,
wherein the switch is ON if a differential voltage obtained by subtracting the voltage at the control end of the semiconductor switch from an output voltage that is output by the voltage output unit is at least a predetermined voltage, and is OFF if the differential voltage is smaller than the predetermined voltage.

2. The power supply control apparatus according to claim 1, further comprising:
a resistor connected between an output end from which the voltage output unit outputs a voltage and the control end of the semiconductor switch.

3. The power supply control apparatus according to claim 1, further comprising:
a capacitor connected between the one end of the power supply path and a current output end of the semiconductor switch.

4. The power supply control apparatus according to claim 1, wherein the second semiconductor switch switches OFF if a negative voltage is applied to the one end of the power supply path, with a potential at another end of the power supply path serving as a reference.

5. The power supply control apparatus according to claim 2, further comprising:
a capacitor connected between the one end of the power supply path and a current output end of the semiconductor switch.

6. The power supply control apparatus according to claim 2, wherein the second semiconductor switch switches OFF if a negative voltage is applied to the one end of the power supply path, with a potential at another end of the power supply path serving as a reference.

7. The power supply control apparatus according to claim 3, wherein the second semiconductor switch switches OFF if a negative voltage is applied to the one end of the power supply path, with a potential at another end of the power supply path serving as a reference.

* * * * *